(12) United States Patent
Toba

(10) Patent No.: US 8,519,468 B2
(45) Date of Patent: Aug. 27, 2013

(54) SEMICONDUCTOR DEVICE

(75) Inventor: Takayuki Toba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/405,570

(22) Filed: Feb. 27, 2012

(65) Prior Publication Data

US 2013/0087844 A1    Apr. 11, 2013

(30) Foreign Application Priority Data

Oct. 5, 2011    (JP) .................................. 2011-220917

(51) Int. Cl.
*H01L 29/788* (2006.01)

(52) U.S. Cl.
USPC .................... 257/316; 257/E29.3; 438/266

(58) Field of Classification Search
USPC .......................................... 257/316; 438/266
See application file for complete search history.

(56) References Cited

U.S. PATENT DOCUMENTS

| | | | |
|---|---|---|---|
| 7,084,030 B2 * | 8/2006 | Lee et al. ...................... | 438/257 |
| 7,579,647 B2 | 8/2009 | Shimizu et al. | |
| 7,728,435 B2 | 6/2010 | Sakuma et al. | |
| 2006/0097309 A1 * | 5/2006 | Shimizu et al. ............... | 257/316 |
| 2006/0220103 A1 * | 10/2006 | Watanobe et al. ............ | 257/316 |
| 2009/0091040 A1 * | 4/2009 | Uchida et al. ................. | 257/773 |
| 2009/0101960 A1 | 4/2009 | Aoki et al. | |

FOREIGN PATENT DOCUMENTS

JP     2009-54941     3/2009

* cited by examiner

*Primary Examiner* — Steven J Fulk

(74) *Attorney, Agent, or Firm* — Oblon, Spivak, McClelland, Maier & Neustadt, L.L.P.

(57) ABSTRACT

A semiconductor device includes: a semiconductor substrate; an element isolation insulator; an insulating block; an interlayer insulating film; and a contact. A plurality of active areas extending in one direction and protruding upward are formed at an upper surface of the substrate. The insulating block is disposed directly on the element isolation insulator. The contact is formed in the interlayer insulating film. A lower end of the contact is connected to an upper surface of the active area. A part of a lower surface of the contact located directly on the insulating block is positioned higher than a part of a lower surface of the contact located directly on the active area.

11 Claims, 14 Drawing Sheets

US 8,519,468 B2

SEMICONDUCTOR DEVICE

CROSS-REFERENCE TO RELATED APPLICATIONS

This application is based upon and claims the benefit of priority from the prior Japanese Patent Application No. 2011-220917, filed on Oct. 5, 2011; the entire contents of (all of) which are incorporated herein by reference.

FIELD

Embodiments described herein relate generally to a semiconductor device.

BACKGROUND

These days, a flash memory, which is a large-capacity and inexpensive nonvolatile semiconductor memory device, is expanding the use and market as a storage memory such as a memory card and a semiconductor disk (SSD; solid state disk). In a NAND flash memory, the upper portion of a silicon substrate is partitioned into a plurality of linear portions and the linear portion is used as an active area. A plurality of memory cells are formed in each active area, and a pair of select gate electrodes are provided on both sides of the plurality of memory cells. A bit line and a source line are provided above the silicon substrate to be connected to the active area. At this time, at least the bit line is connected to the active area via a contact.

A still larger capacity and lower cost are required for the storage memory, and reducing the processing dimensions has been advanced in order to achieve them. However, when the downsizing of the memory is advanced and the arrangement period of the active area is shortened, the distance between the contact (CB) connected to an active area and an active area (AA) disposed adjacent to the active area is shortened, and the breakdown voltage therebetween is decreased. Therefore, the arrangement period of the active area cannot be shortened much, and this leads to a limitation on the downsizing.

DETAILED DESCRIPTION

Figure 1:
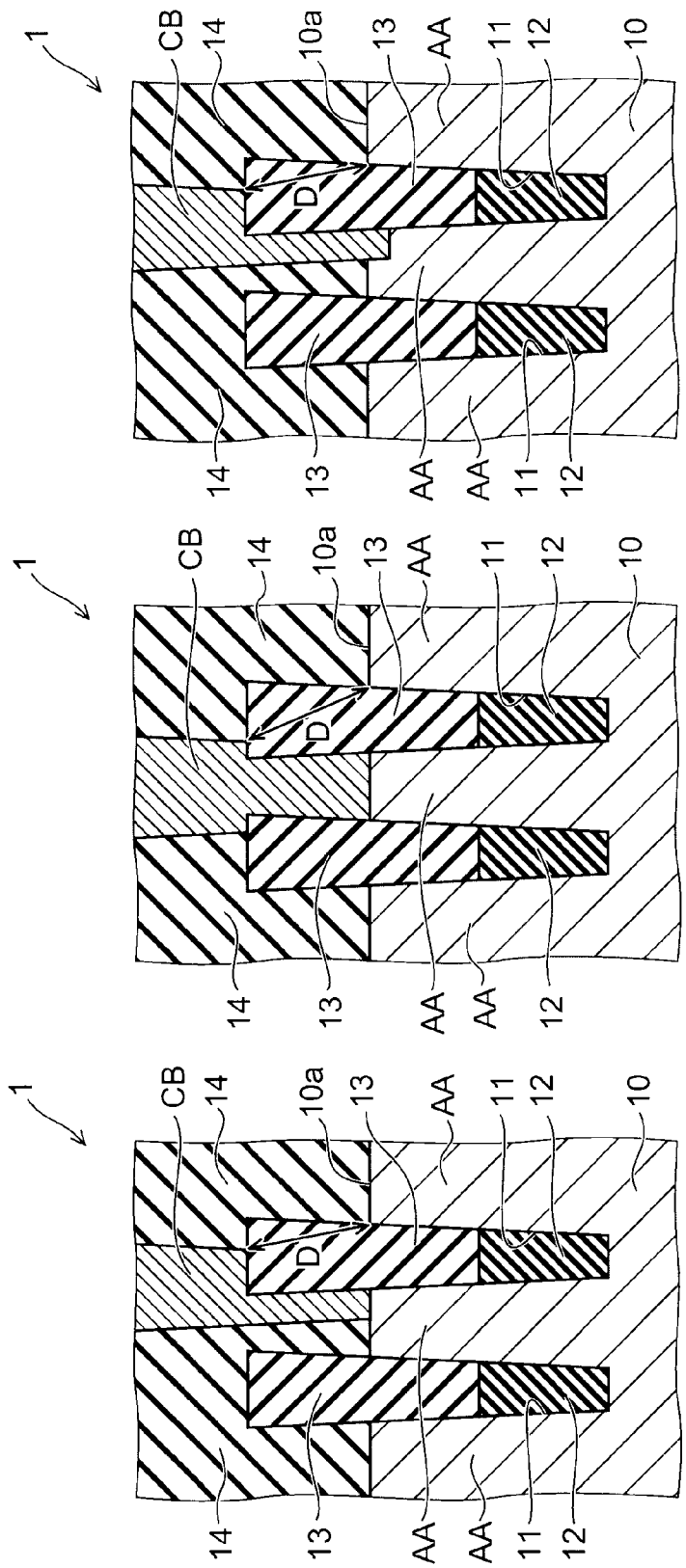
FIGS. 1A to 1C are cross-sectional views illustrating a semiconductor device according to the embodiment.

In general, according to one embodiment, a semiconductor device includes: a semiconductor substrate, a plurality of active areas extending in one direction and protruding upward being formed at an upper surface of the semiconductor substrate; an element isolation insulator embedded in a lower portion of a trench between the active areas; an insulating block made of a first insulating material and disposed directly on the element isolation insulator, a lower portion of the insulating block being disposed in the trench, an upper portion of the insulating block protruding above an upper end of the active area; an interlayer insulating film made of a second insulating material different from the first insulating material and provided on an upper side of the semiconductor substrate and the insulating block; and a contact formed in the interlayer insulating film, a lower end of the contact being connected to an upper surface of the active area, a part of a lower surface of the contact located directly on the insulating block being positioned higher than a part of a lower surface of the contact located directly on the active area.

According to another embodiment, a semiconductor device includes: a semiconductor substrate, a plurality of active areas extending in one direction and protruding upward being formed at an upper surface of the semiconductor substrate; an element isolation insulator made of silicon oxide and embedded in a lower portion of a trench between the active areas; an insulating block made of silicon nitride and disposed directly on the element isolation insulator, a lower portion of the insulating block being disposed in the trench, an upper portion of the insulating block protruding above an upper end of the active area; an interlayer insulating film made of silicon oxide and provided on an upper side of the semiconductor substrate and the insulating block; a contact formed in the interlayer insulating film, a lower end of the contact being connected to an upper surface of the active area; select gate electrodes individually provided in portions of the active area on both sides of the contact and extending in another direction intersecting with the one direction; a tunnel film provided on a portion of the active area located on an opposite side of the select gate electrode from the contact; a plurality of charge storage films, provided on the tunnel film, and arranged along the one direction; an inter-electrode insulating film provided on the charge storage films; and a control gate electrode provided above the charge storage films via the inter-electrode insulating film and extending in the other direction, a part of a lower surface of the contact located directly on the insulating block being positioned higher than a part of a lower surface of the contact located directly on the active area, a height of an upper end of the insulating block from an upper surface of the active area being larger than half an arrangement period of the active area.

Hereinbelow, embodiments of the invention are described with reference to the drawings.

First, a first embodiment is described.

FIGS. 1A to 1C are cross-sectional views illustrating a semiconductor device according to the embodiment.

The semiconductor device according to the embodiment is a NAND flash memory.

As shown in FIG. 1A, a semiconductor device 1 according to the embodiment includes a silicon substrate 10. A plurality of active areas AA protruding upward and extending in one direction are formed at the upper surface 10a of the silicon substrate 10. When viewing the configuration, the active area AA is a protruding stripe formed at the upper surface 10a of the silicon substrate 10. The region between active areas AA of the upper surface 10a of the silicon substrate 10 forms a trench 11.

An element isolation insulator (STI; shallow trench isolation) 12 made of an insulating material such as, for example, silicon oxide is embedded in a lower portion of the trench 11.

An insulating block 13 made of an insulating material such as, for example, silicon nitride is provided directly on the STI 12. The lower portion of the insulating block 13 is embedded in an upper portion of the trench 11, and the upper portion of the insulating block 13 protrudes above the upper end of the active area AA. An interlayer insulating film 14 is provided on the upper side of the silicon substrate 10, the STI 12, and the insulating block 13. The interlayer insulating film 14 is formed of an insulating material different from the material of the insulating block 13, for example, formed of silicon oxide.

A contact CB is provided in the interlayer insulating film 14. The contact CB is made of a conductive material such as a metal, and extends vertically. A portion of the contact CB is disposed directly on the active area AA and penetrates through the interlayer insulating film 14, and the lower end reaches the lower surface of the interlayer insulating film 14; thereby, the portion contacts the upper surface of the active area AA to be connected to the active area AA. On the other hand, the rest portion of the contact CB is disposed directly on the insulating block 13, does not penetrate through the insulating block 13, and does not reach the lower surface of the insulating block 13. Thereby, the lower surface of the portion located directly on the insulating block 13 of the contact CB is located higher than the lower surface of the portion located directly on the active area AA of the contact CB, and the contact CB is in a shape going around the insulating block 13. The contact CB may be also formed of a stacked structure of a barrier metal thin layer made of titanium, titanium nitride, or the like and a metal layer made of tungsten or the like formed on the barrier metal thin layer.

Although FIG. 1A shows the case where the contact CB is in contact only with the insulating block 13 on one side, as shown in FIG. 1B also a configuration is possible in which the width of the lower end of the contact CB is larger than the width of the upper end of the active area AA and the contact CB is in contact with the insulating blocks 13 on both sides. In this case, since the contact CB is in contact with the active area AA over the entire width direction, the contact area is increased and the contact resistance between the contact CB and the active area AA is decreased. Even if it is intended to form the contact CB so that the state shown in FIG. 1B may be obtained, that is, the extension line of the central axis of the contact CB may pass through the center in the width direction of the active area AA, there is actually a case where the formation position of the contact CB is out of alignment into a configuration like FIG. 1A. Furthermore, although FIGS. 1A and 1B show an example in which the contact CB does not dig down into the silicon substrate 10, as shown in FIG. 1C also a configuration is possible in which the contact CB digs down into the silicon substrate 10 and the lower end of the contact CB is located lower than the upper surface 10a of the silicon substrate 10.

The material forming the insulating block 13 needs only to be an insulating material different from the material forming the interlayer insulating film 14. Thereby, when forming a contact hole for the contact CB, only the interlayer insulating film 14 can be etched while the insulating block 13 is hardly etched. Consequently, as shown in FIGS. 1A to 1C, the contact CB can be shaped to go around the insulating block 13.

Next, effects of the embodiment are described.

In the embodiment, the insulating block 13 is provided directly on the STI 12, the upper portion of the insulating block 13 protrudes above the upper end of the active area AA, and the contact CB penetrates through the interlayer insulating film 14 to reach the active area AA but does not substantially enter the insulating block 13. Thereby, the lower surface of the portion located directly on the insulating block 13 of the contact CB is located higher than the lower surface of the portion located directly on the active area AA of the contact CB. Consequently, the distance D between an active area AA and the contact CB connected to an active area AA adjacent to the active area AA (hereinafter referred to as an "inter-AA/CB distance") can be increased. Therefore, even when the variation in the dimensions of the components and the positional misalignment between the contact CB and the active area AA are taken into consideration, the arrangement period of the active area AA can be shortened while ensuring such an inter-AA/CB distance as can ensure a sufficient breakdown voltage between the active area AA and the contact CB. Consequently, the semiconductor device 1 can be downsized.

Next, a comparative example of the embodiment is described.

Figure 2:
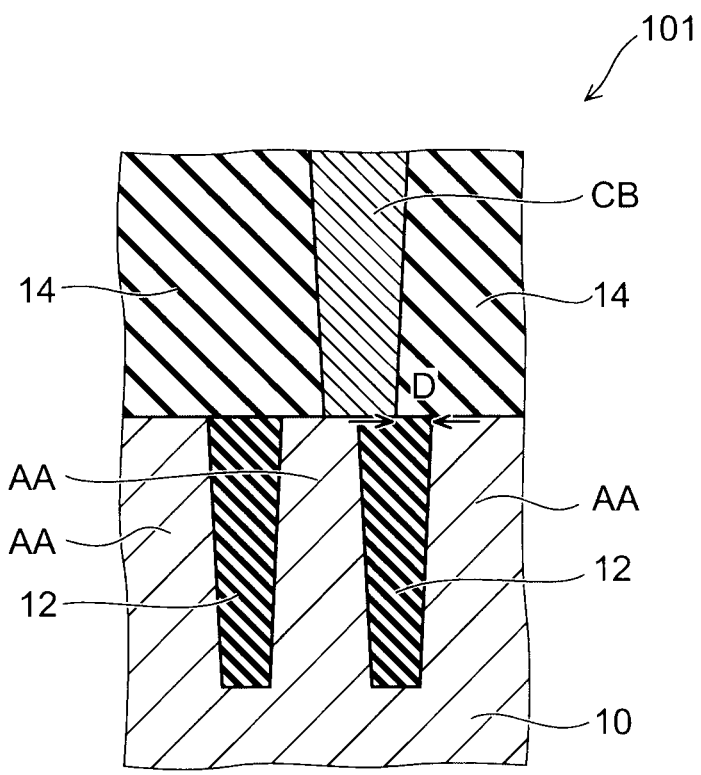
FIG. 2 is a cross-sectional view illustrating a semiconductor device according to the comparative example.

FIG. 2 is a cross-sectional view illustrating a semiconductor device according to the comparative example.

As shown in FIG. 2, in a semiconductor device 101 according to the comparative example, the insulating block 13 (see FIG. 1A) is not provided, and the upper surface of the active area AA and the upper surface of the STI 12 constitute the same plane. In this case, the inter-AA/CB distance D is shortened as compared to the first embodiment described above. Therefore, it is difficult to shorten the arrangement period of the active area AA while achieving an inter-AA/CB distance necessary to ensure a breakdown voltage, and therefore the downsizing of the semiconductor device is difficult.

Next, a second embodiment is described.

The embodiment is an embodiment illustrating the first embodiment described above more specifically.

Figure 3:
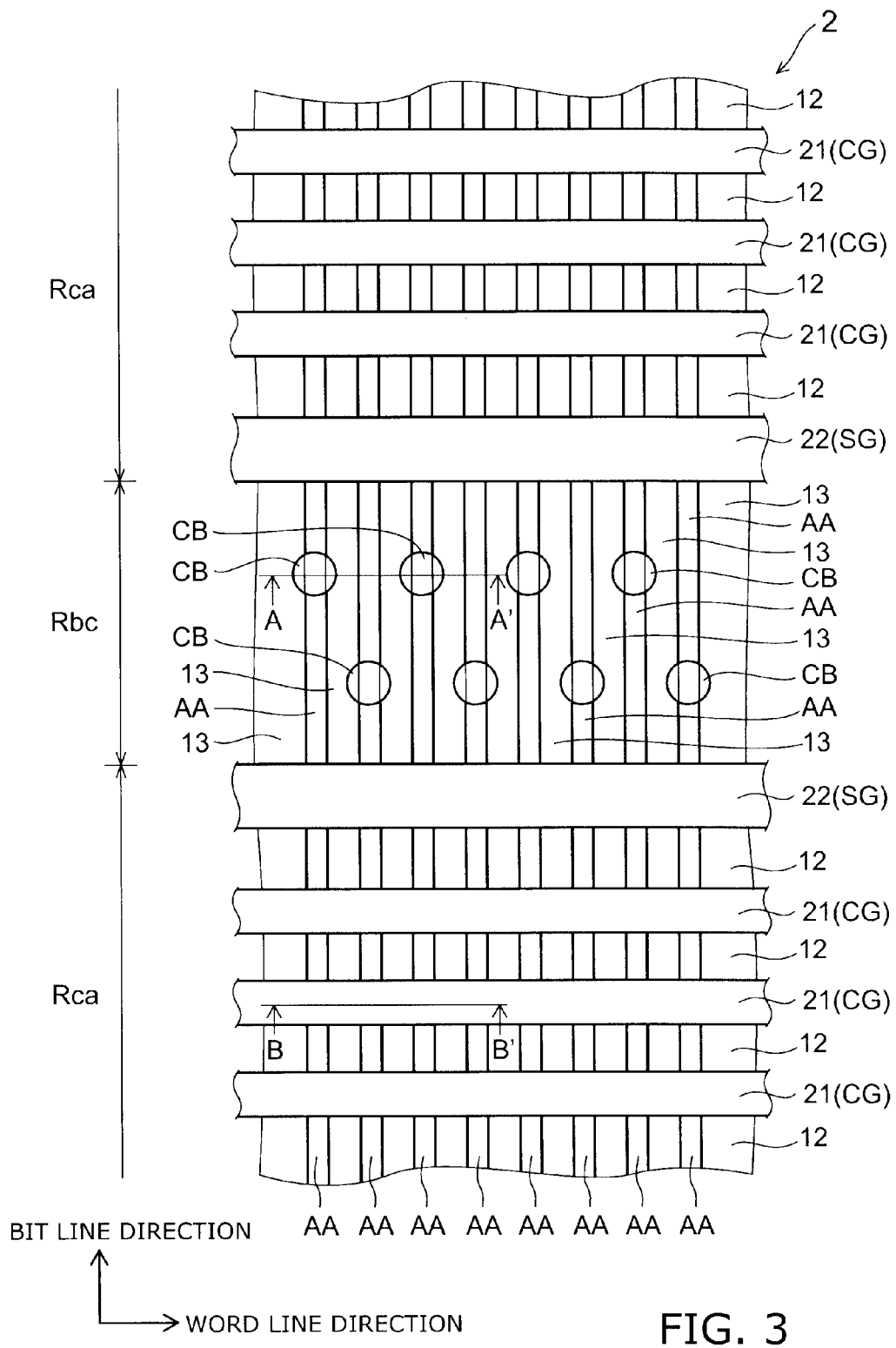
FIG. 3 is a plan view illustrating a semiconductor memory device according to the embodiment.

FIG. 3 is a plan view illustrating a semiconductor memory device according to the embodiment.

Figure 4A:
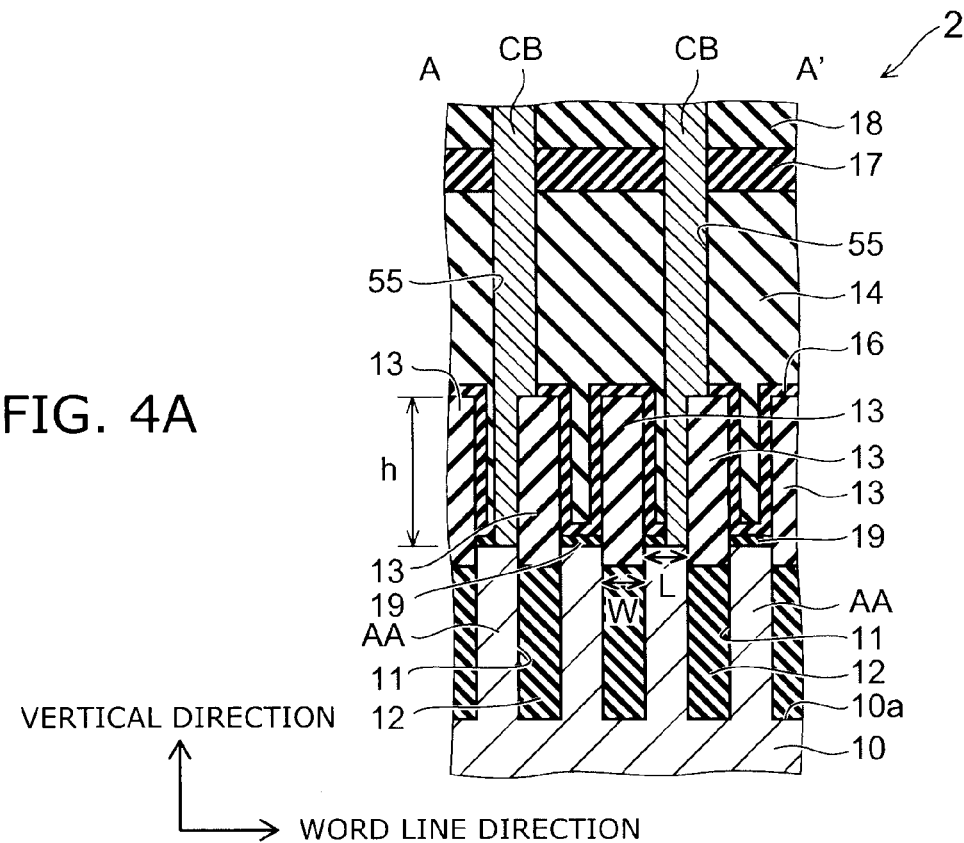
FIG. 4A is a cross-sectional view taken along line A-A' shown in FIG. 3.
Figure 4B:
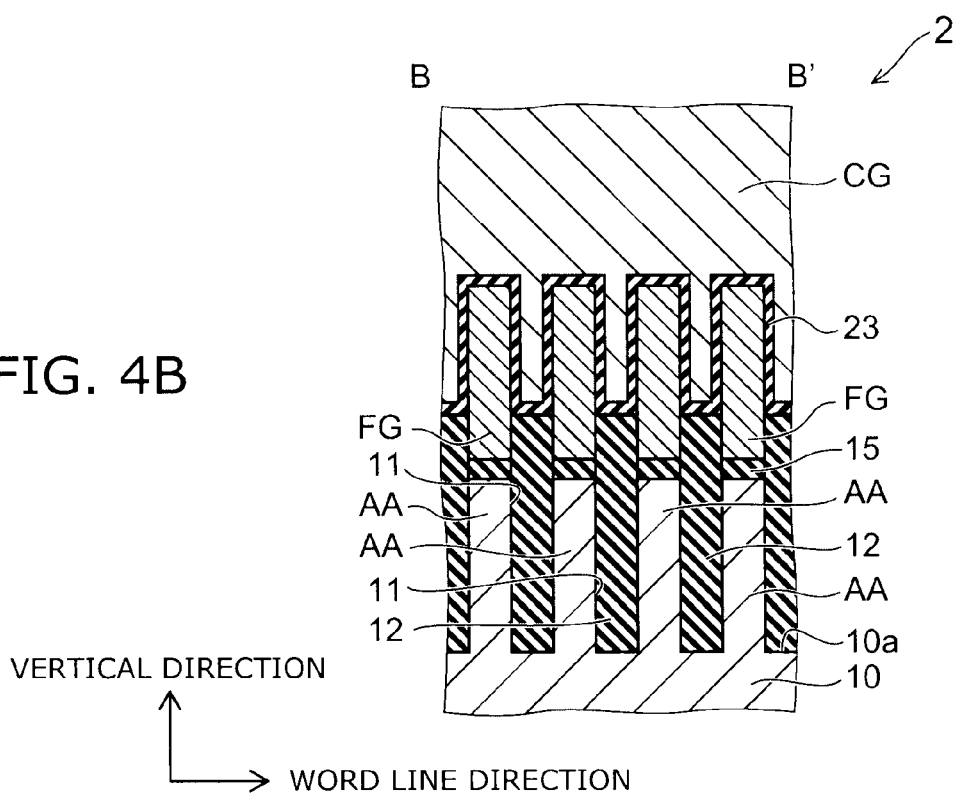
FIG. 4B is a cross-sectional view taken along line B-B' shown in FIG. 3.

FIG. 4A is a cross-sectional view taken along line A-A' shown in FIG. 3, and FIG. 4B is a cross-sectional view taken along line B-B' shown in FIG. 3.

Also the semiconductor device according to the embodiment is a NAND flash memory.

As shown in FIG. 3 and FIGS. 4A and 4B, a semiconductor device 2 according to the embodiment includes the silicon substrate 10. As viewed from above, a memory region and a peripheral circuit region are defined in the silicon substrate 10. In the memory region, a plurality of cell array regions Rca are defined away from each other along one direction, and the region between cell array regions Rca forms a bit line contact region Rbc or a source line contact region (not shown) alternately. Hereinafter, the arrangement direction of the cell array region Rca is referred to as a "bit line direction." Furthermore, the direction orthogonal to the bit line direction out of the directions parallel to the upper surface 10a of the silicon substrate 10 is referred to as a "word line direction."

A plurality of active areas AA protruding upward and extending in the bit line direction are formed at the upper surface 10a of the silicon substrate 10 so as to connect the plurality of cell array regions Rca. The active areas AA are periodically arranged in the word line direction. The STI 12 made of silicon oxide is embedded in a lower portion of the trench 11 between active areas AA, and electrically isolates the active areas AA.

As shown in FIG. 4A, in the bit line contact region Rbc, a contact layer (not shown) is formed in the uppermost portion of the active area AA, and a silicon oxide film 19 is provided directly on the active area AA.

The insulating block 13 made of, for example, silicon nitride is provided directly on the STI 12. The upper portion of the insulating block 13 protrudes above the upper end of the active area AA. The height h of the upper end of the insulating block 13 from the upper surface of the active area AA, that is, the distance between the upper surface of the active area AA and the upper end of the insulating block 13 in the vertical direction is larger than half the sum of the width L of the upper end of the active area AA and the width W of the upper end of the STI 12. That is, as illustrated by the following mathematical formula, the height h is larger than half the arrangement period of the active area AA in the word line direction.

$$h > (L+W)/2$$

In the semiconductor device 2, a stopper film 16 made of, for example, silicon nitride is provided so as to cover the insulating block 13 and the silicon oxide film 19. The stopper film 16 is thin enough not to be completely embedded between adjacent insulating blocks 13 and is bent to reflect the configuration in which the insulating block 13 protrudes upward from between active areas AA. The stopper film 16 is prevented from contacting the silicon substrate 10 by the silicon oxide film 19. The interlayer insulating film 14 is provided on the stopper film 16. The interlayer insulating film 14 is made of, for example, silicon oxide, fills the portion between insulating blocks 13, and is thick enough to be disposed also above the insulating block 13. A stopper film 17 made of, for example, silicon nitride is provided on the interlayer insulating film 14, and an interlayer insulating film 18 is provided thereon. For convenience of illustration, the silicon oxide film 19, the stopper film 16, the interlayer insulating film 14, the stopper film 17, and the interlayer insulating film 18 are omitted in FIG. 3.

The contact CB extending vertically is provided so as to penetrate through the silicon oxide film 19, the stopper film 16, the interlayer insulating film 14, the stopper film 17, and the interlayer insulating film 18. The contact CB is provided for each active area AA and connected to each active area AA. Each contact CB has a substantially columnar shape thinning toward the bottom, for example, a substantially circular columnar shape. The width of the lower end of the contact CB in the word line direction is larger than the width of the upper end of the active area AA in the word line direction.

A portion of each contact CB is provided directly on the insulating block 13, and is in contact with the upper surface of the insulating block 13. The rest portion of each contact CB is provided directly on the active area AA, and is in contact with the upper surface of the active area AA. The contact CB is in contact with the side surface of the insulating block 13, but does not enter the interior of the insulating block 13. As shown in FIG. 3, as viewed from above, the contacts CB are arranged in a zigzag fashion. That is, the positions in the bit line direction of the two contacts CB connected adjacent active areas AA are different from each other. Therefore, the distance between contacts CB is longer than the distance between active areas AA and longer than the inter-AA/CB distance.

A bit line (not shown) extending in the bit line direction is provided in a region on the interlayer insulating film 18 including the region immediately above the active area AA. Each bit line is connected to the upper end of each contact CB.

On the other hand, as shown in FIG. 3 and FIG. 4B, in the cell array region Rca, the upper portion of the STI 12 protrudes upward from the trench 11 between active areas AA. A tunnel film 15 is provided directly on the active area AA. The tunnel film 15 is an insulating film, is a film that conducts a tunnel current when a prescribed voltage in the range of the drive voltage of the semiconductor device 2 is applied, and is formed of, for example, silicon oxide. A plurality of stacked bodies 21 extending in the word line direction are formed on the tunnel film 15. A stacked body 22 extending in the word line direction is formed on both sides of the set formed of the plurality of stacked bodies 21 on a one-to-one basis. The stacked bodies 21 and 22 are disposed so as to stretch over the plurality of active areas AA. Further, a source/drain region (not shown) is formed in the uppermost portion of the active area AA other than the region immediately under the stacked bodies 21 and 22.

In each stacked body 21, a floating gate electrode FG made of a conductive material, for example polysilicon doped with an impurity, is provided as a charge storage member. The floating gate electrode FG is provided for each stacked body 21 and for each active area AA. That is, as viewed from above, the floating gate electrode FG is arranged in a matrix configuration along both the word line direction and the bit line direction. The lower portion of the floating gate electrode FG is disposed between STIs 12, and the upper portion of the floating gate electrode FG protrudes above the upper surface of the STI 12. The floating gate electrode FG may be also formed of a metal such as tungsten or a metal silicide such as nickel silicide.

In the stacked body 21, an inter-electrode insulating film 23 is provided so as to cover the upper surface of the STI 12 and the upper surface and the side surface of the portion protruding from between STIs 12 of the floating gate electrode FG. The inter-electrode insulating film 23 is a film that conducts substantially no current even when a voltage is applied in the range of the drive voltage of the semiconductor device 2, and is formed of, for example, silicon oxide. On the inter-electrode insulating film 23, a control gate electrode CG made of a conductive material, for example polysilicon doped with an impurity, is provided to form a word line. The control gate electrode CG may be also formed of a metal such as tungsten or a metal silicide such as nickel silicide.

On the other hand, a select gate electrode SG extending in the word line direction is provided in each stacked body 22. The select gate electrode SG is formed by, for example, a configuration in which the conductive material forming the floating gate electrode FG and the conductive material forming the control gate electrode CG are connected via an opening (not shown) of the inter-electrode insulating film 23 in a region immediately above the active area AA.

The stopper film 16, the interlayer insulating film 14, the stopper film 17, and the interlayer insulating film 18 (see FIG. 4A for all of them) are provided so as to cover the stacked bodies 21 and 22. The bit line described above passes on the interlayer insulating film 18.

Next, a method for manufacturing a semiconductor device according to the embodiment is described.

FIG. 5A to FIG. 12B are process cross-sectional views illustrating a method for manufacturing a semiconductor device according to the embodiment. Of the drawings, the drawings of the numbers including "A" show a cross section corresponding to FIG. 4A, and the drawings of the numbers including "B" show a cross section corresponding to FIG. 4B.

Figure 5A:
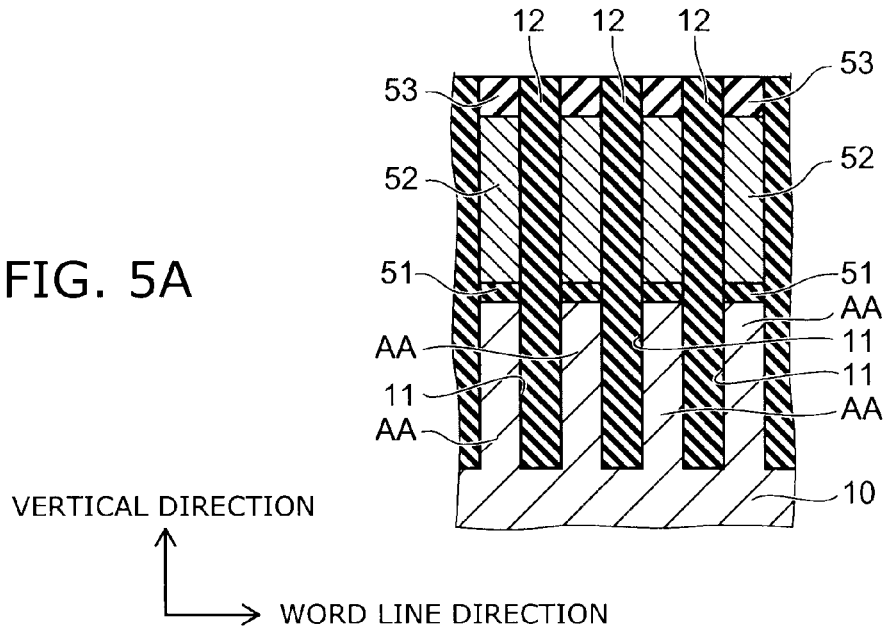
FIG. 5A to FIG. 12B are process cross-sectional views illustrating a method for manufacturing a semiconductor device according to the embodiment.
Figure 5B:
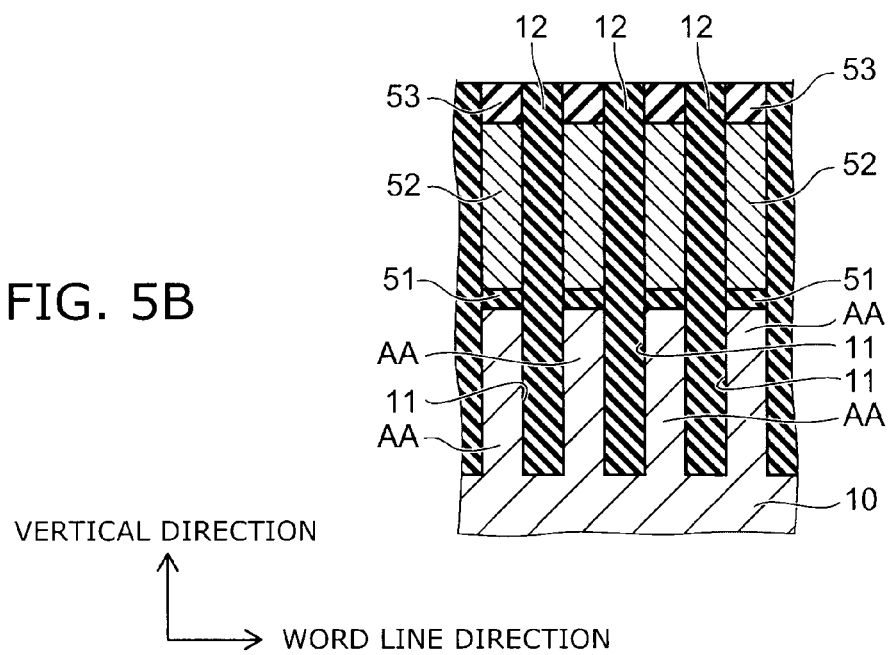

First, as shown in FIGS. 5A and 5B, the silicon substrate 10 is prepared. Next, a silicon oxide film 51 that forms the tunnel film 15 (see FIG. 4B) is film-formed on the entire surface of the silicon substrate 10, and then a polysilicon film 52 that forms the floating gate electrode FG (see FIG. 4B) is film-formed. Next, a mask member 53 is formed on the polysilicon film 52. The mask member 53 is formed by a method in which a mask material film is deposited on the entire surface, a resist film (not shown) is film-formed thereon, the resist film is patterned by the lithography method, and the patterned resist film is used as a mask to perform etching such as RIE (reactive ion etching). The mask member 53 is formed in a striped configuration extending in the bit line direction so as to cover the region where the active area AA is to be formed.

Next, the mask member 53 is used as a mask to perform etching such as RIE. Thereby, the polysilicon film 52, the silicon oxide film 51, and an upper portion of the silicon substrate 10 are selectively removed. Consequently, the polysilicon film 52 and the silicon oxide film 51 are divided along the word line direction, and the trench 11 is formed in the upper portion of the silicon substrate 10. Next, silicon oxide is deposited on the entire surface, and the STI 12 is formed in the trench 11 and a region directly thereon. Next, the mask member 53 is used as a stopper to perform planarization processing such as CMP (chemical mechanical polishing).

Figure 6A:
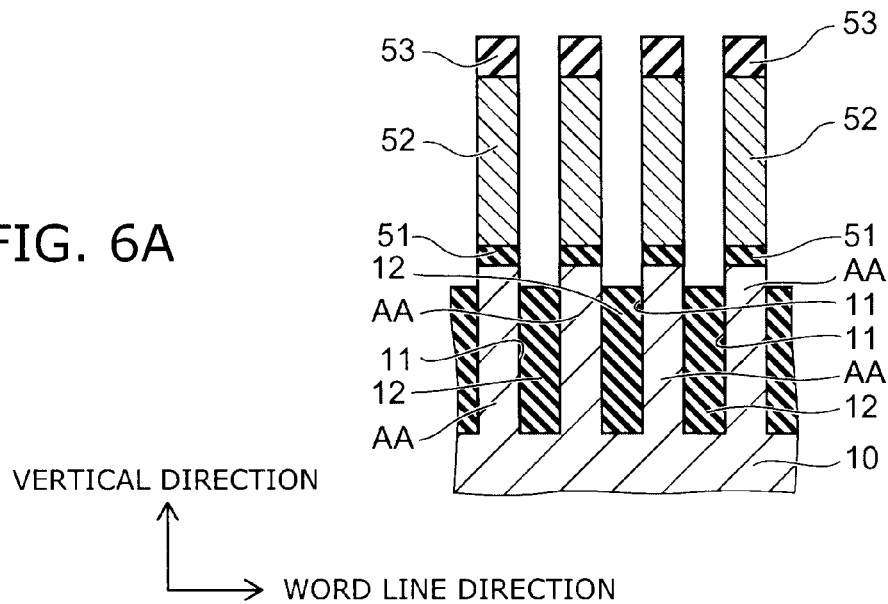
Figure 6B:
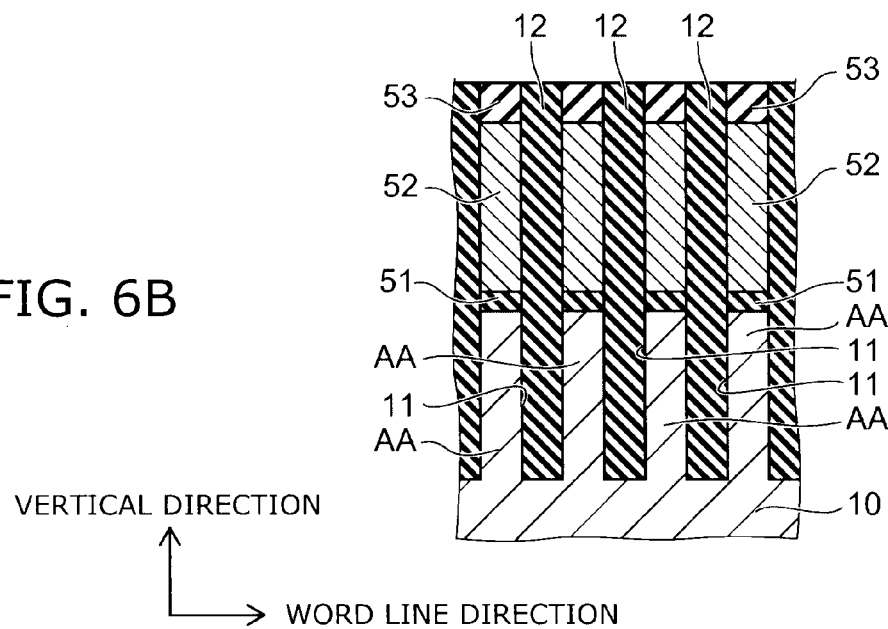

Next, as shown in FIGS. 6A and 6B, a resist mask (not shown) is formed so as to cover the cell array region Rca and expose the bit line contact region Rbc. Next, the resist mask is used as a mask to perform etching such as RIE. Thereby, in the bit line contact region Rbc, the upper surface of the STI 12 is recessed and located lower than the upper surface of the active area AA. Consequently, the STI 12 remains only in a lower portion of the trench 11.

Figure 7A:
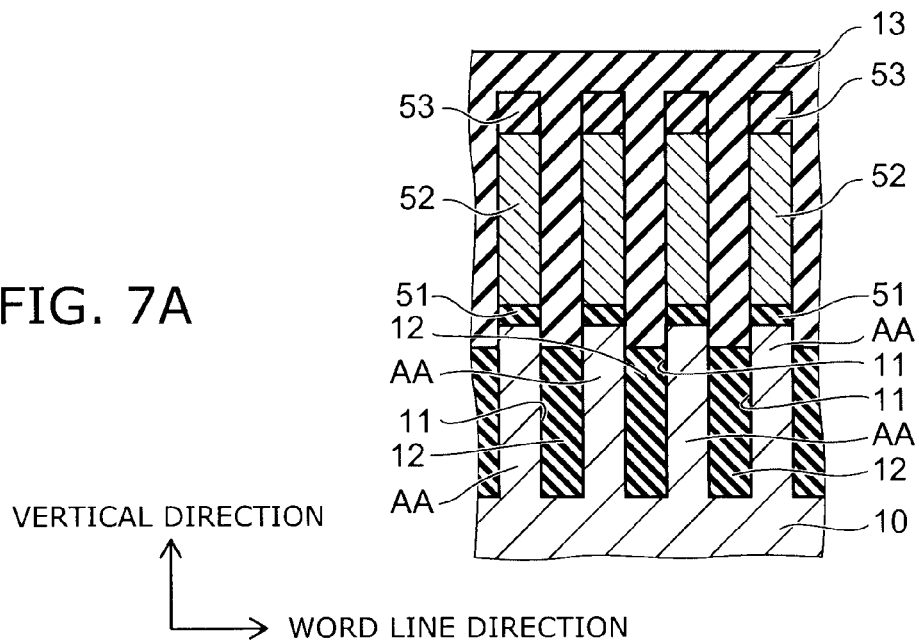
Figure 7B:
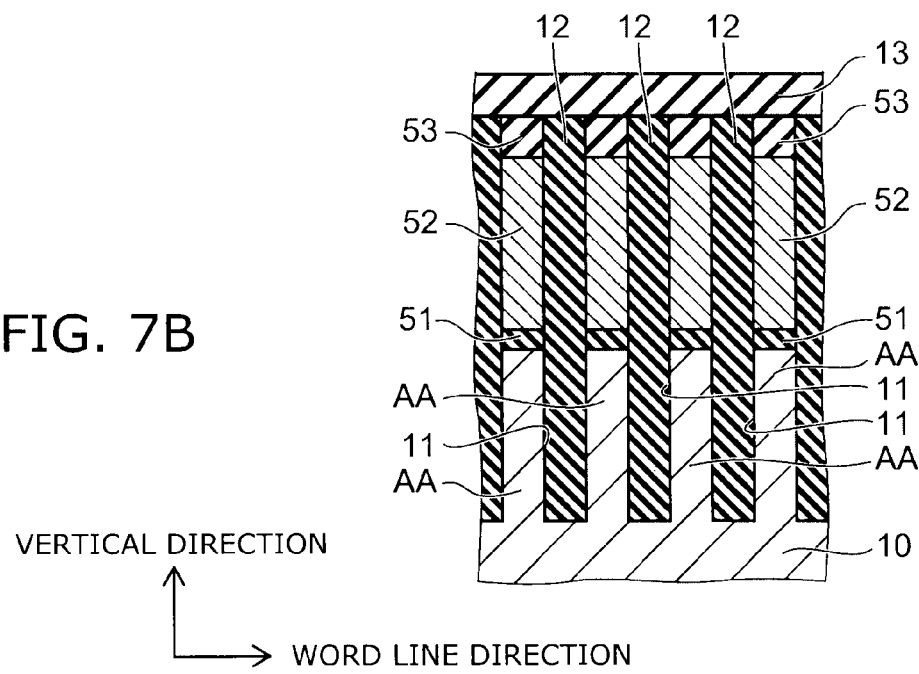

Next, as shown in FIGS. 7A and 7B, silicon nitride is deposited on the entire surface to form the insulating block 13. In the bit line contact region Rbc, the insulating block 13 fills the upper portion of the trench 11 and covers the silicon oxide film 51, the polysilicon film 52, and the mask 53. On the other hand, in the cell array region Rca, the insulating block 13 is disposed only on the upper side of the mask member 53.

Figure 8A:
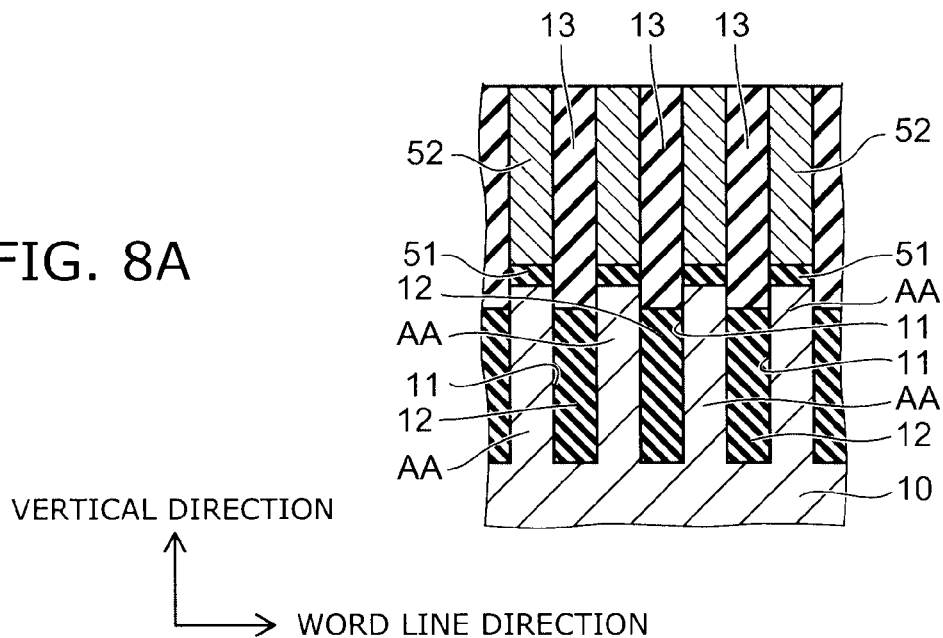
Figure 8B:
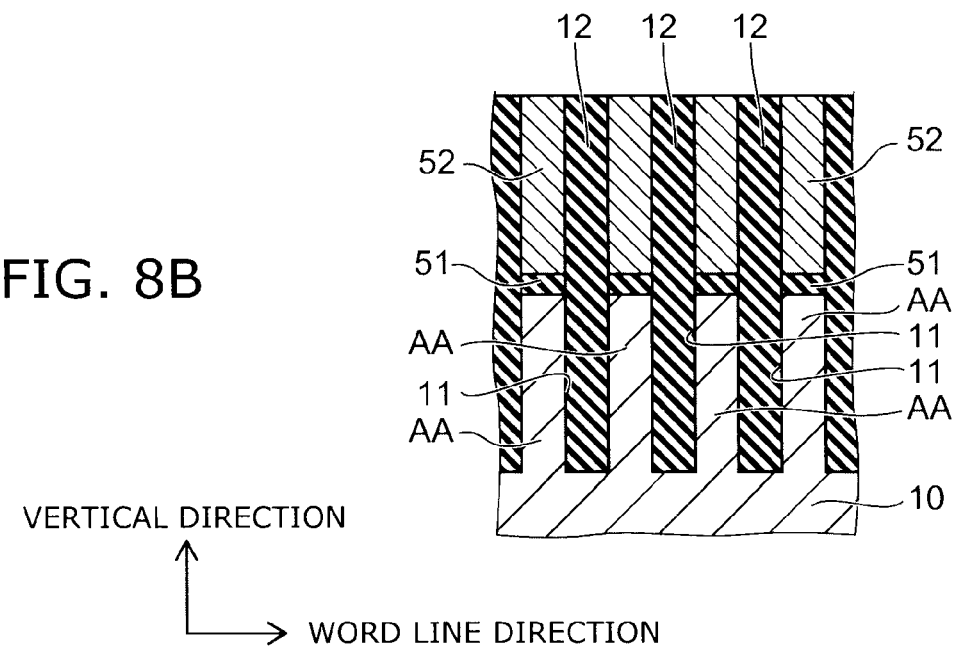

Next, as shown in FIGS. 8A and 8B, the polysilicon film 52 is used as a stopper to perform planarization processing such as CMP. Thereby, the mask member 53 (see FIGS. 7A and 7B) and the portion located above the polysilicon film 52 of the insulating block 13 are removed.

Figure 9A:
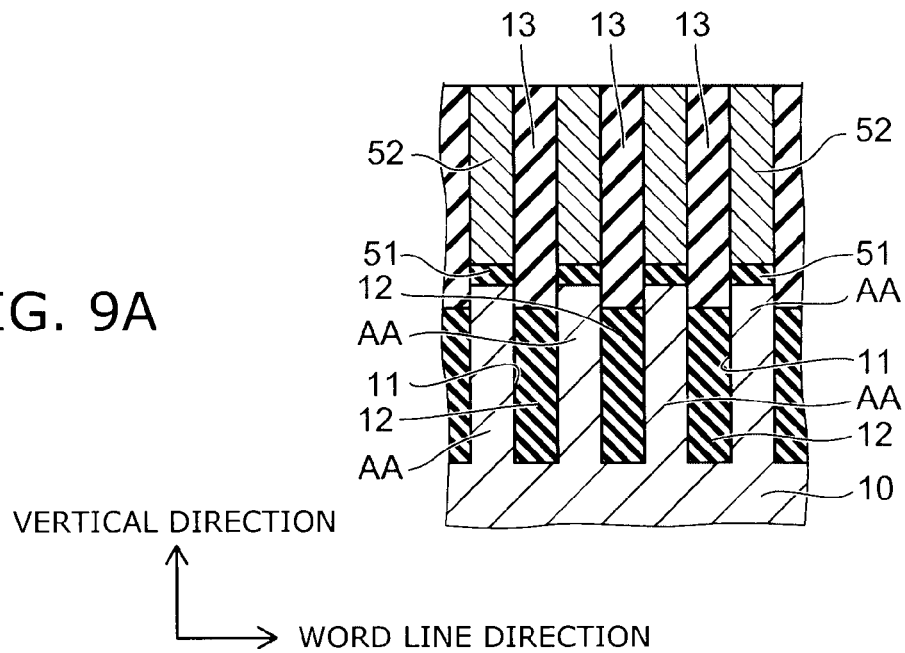
Figure 9B:
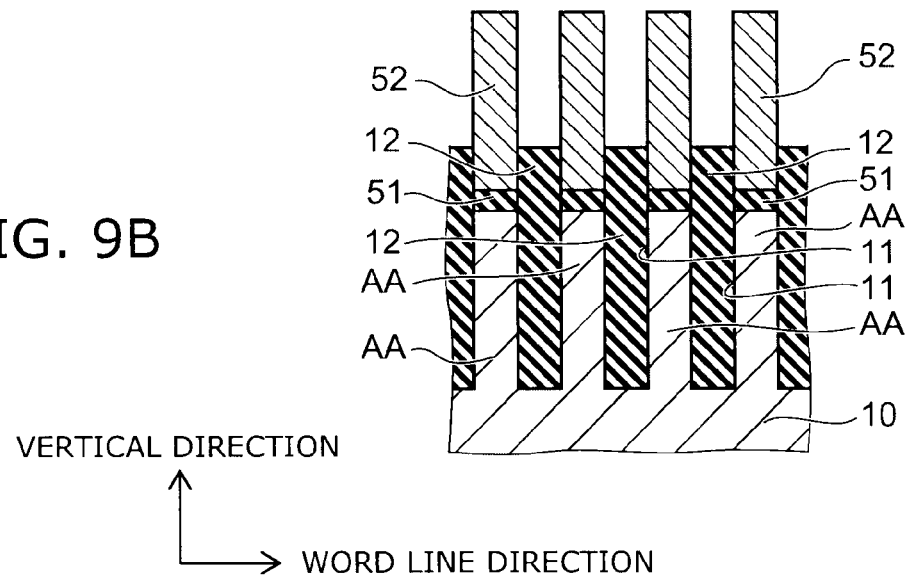

Next, as shown in FIGS. 9A and 9B, etching is performed on the entire surface under the conditions where the etching rate of silicon oxide is higher than the etching rate of silicon nitride. Thereby, in the cell array region Rca, the upper surface of the STI 12 is recessed to be located between the upper surface and the lower surface of the polysilicon film 52. Consequently, in the cell array region Rca, the insulating portion (the STI 12) is shaped to sink with respect to the conductive portion (the polysilicon film 52); and on the other hand, in the bit line contact region Rbc, the upper surface of the insulating portion (the insulating block 13) is kept at a height almost equal to the upper surface of the conductive portion (the polysilicon film 52).

Figure 10A:
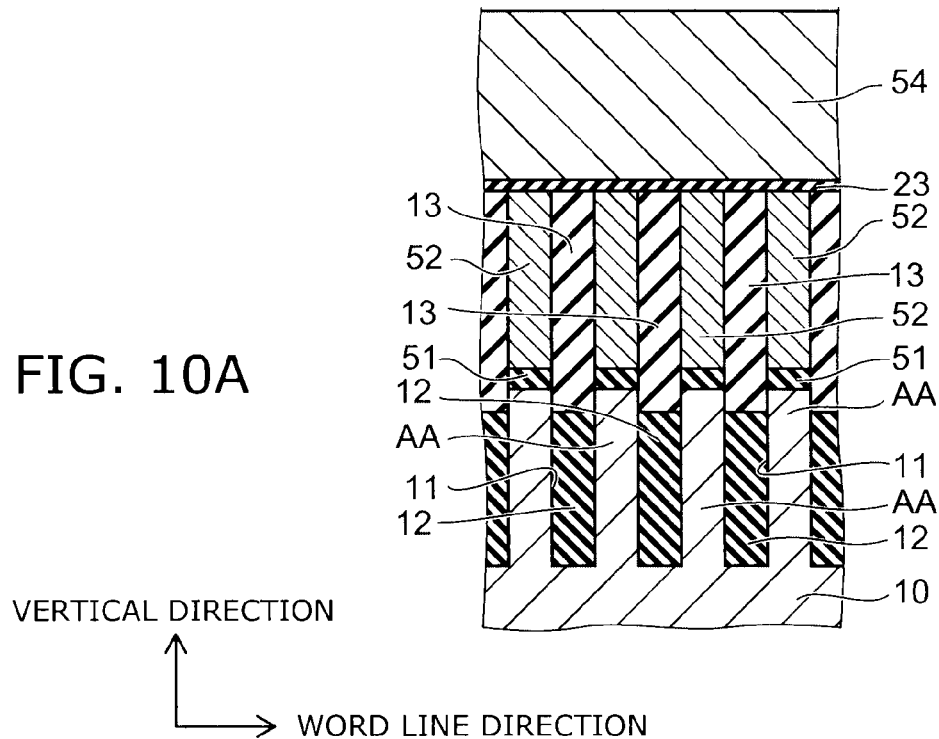
Figure 10B:
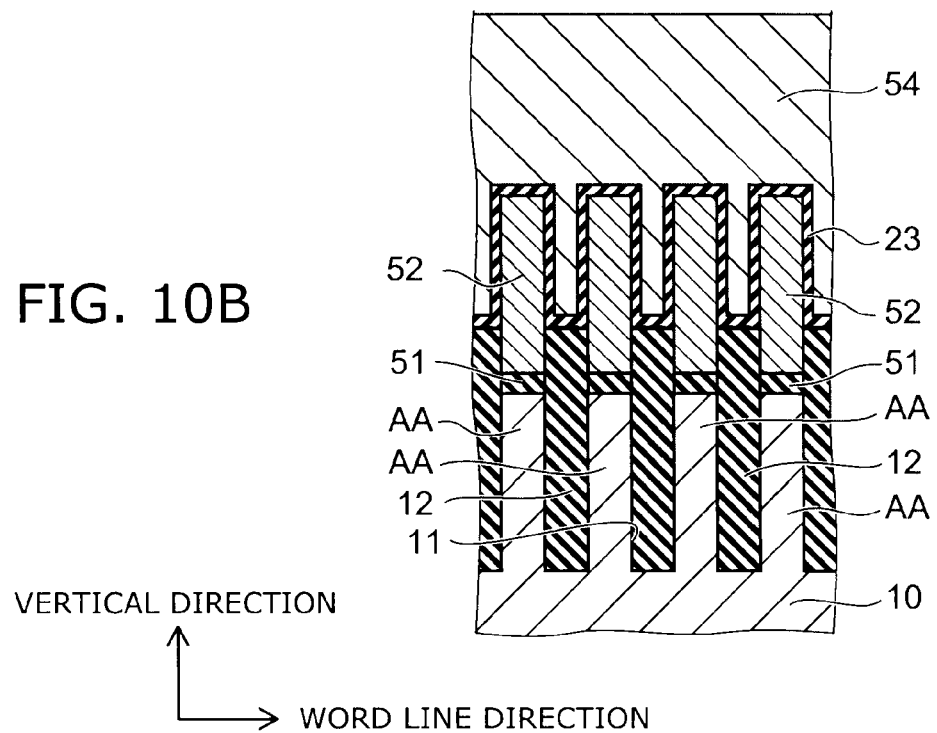

Next, as shown in FIGS. 10A and 10B, silicon oxide is deposited on the entire surface to form the inter-electrode insulating film 23. Next, in part of the region where the select gate electrode SG (see FIG. 4B) is to be formed, an opening (not shown) is formed in the inter-electrode insulating film 23. Next, a conductive material such as polysilicon doped with an impurity is deposited on the entire surface to form a conductive film 54. In part of the region where the select gate electrode SG is to be formed, the conductive film 54 is in contact with the polysilicon film 52 via the opening of the inter-electrode insulating film 23.

Figure 11A:
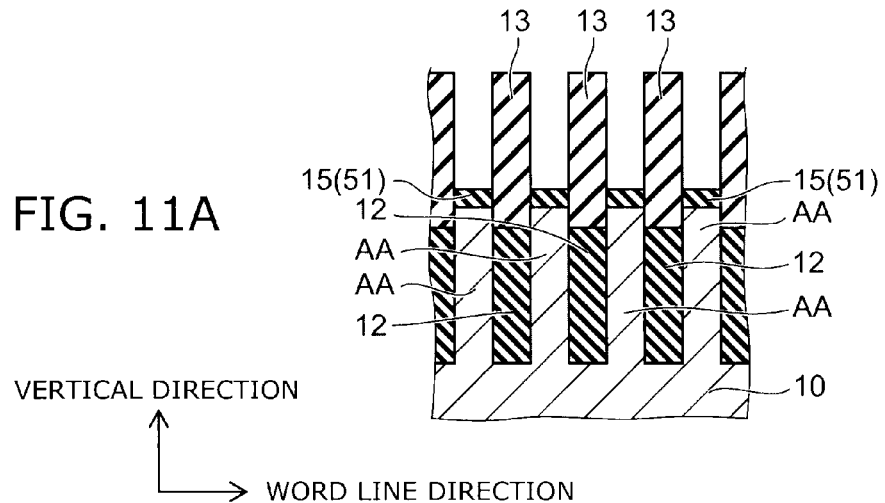
Figure 11B:
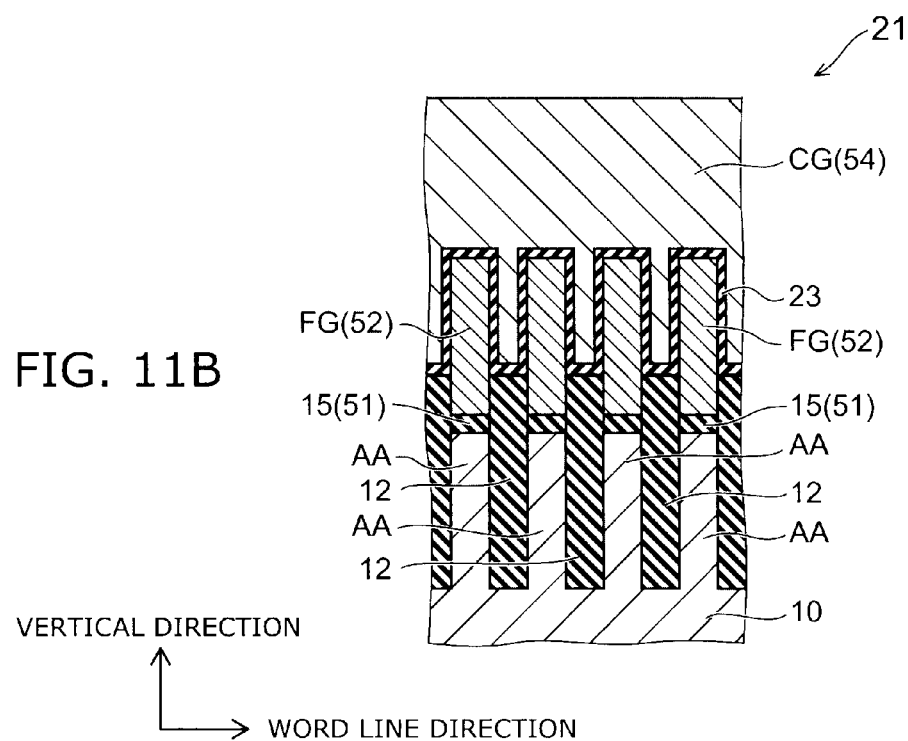

Next, as shown in FIGS. 11A and 11B, a mask (not shown) that covers the region where the control gate electrode CG and the select gate electrode SG are to be formed and exposes the other region is formed, and the mask is used to perform etching such as RIE. Thereby, the conductive film 54, the inter-electrode insulating film 23, the polysilicon film 52, and the silicon oxide film 51 are selectively removed. Consequently, as shown in FIG. 11A, the conductive film 54, the inter-electrode insulating film 23, the polysilicon film 52, and the silicon oxide film 51 are removed in the bit line contact region Rbc.

As shown in FIG. 11B, in the cell array region Rca, the conductive film 54, the inter-electrode insulating film 23, the polysilicon film 52, and the silicon oxide film 51 are divided along the bit line direction to form the stacked bodies 21 and 22 (see FIG. 3) extending in the word line direction. At this time, the portion located in the stacked body 21 of the conductive film 54 forms the control gate electrode CG extending in the word line direction. The portions located in the stacked body 22 of the conductive film 54 and the polysilicon film 52 form the select gate electrode SG extending in the word line direction. The conductive film 54 and the polysilicon film 52 constituting the select gate electrode SG are connected to each other via the opening (not shown) of the inter-electrode insulating film 23.

Next, the stacked bodies 21 and 22 are used as a mask to ion-implant an impurity. Thereby, in the bit line contact region Rbc, a contact layer (not shown) is formed in the uppermost portion of the active area AA, and in the cell array region Rca, a source/drain region (not shown) is formed in a region of the uppermost portion of the active area AA other than the region immediately under the stacked bodies 21 and 22.

Figure 12A:
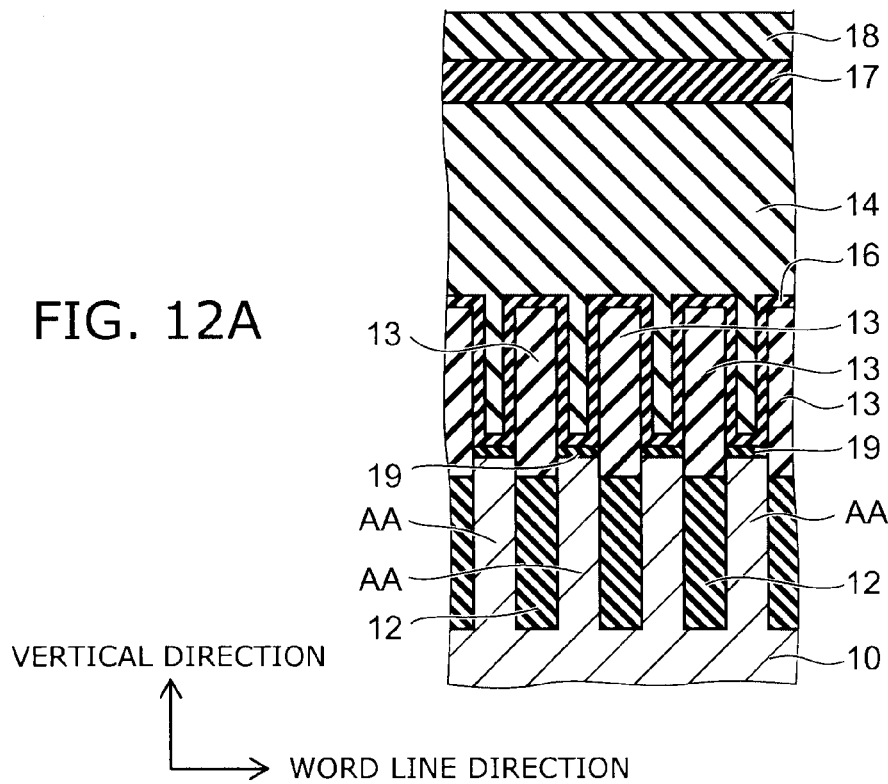
Figure 12B:
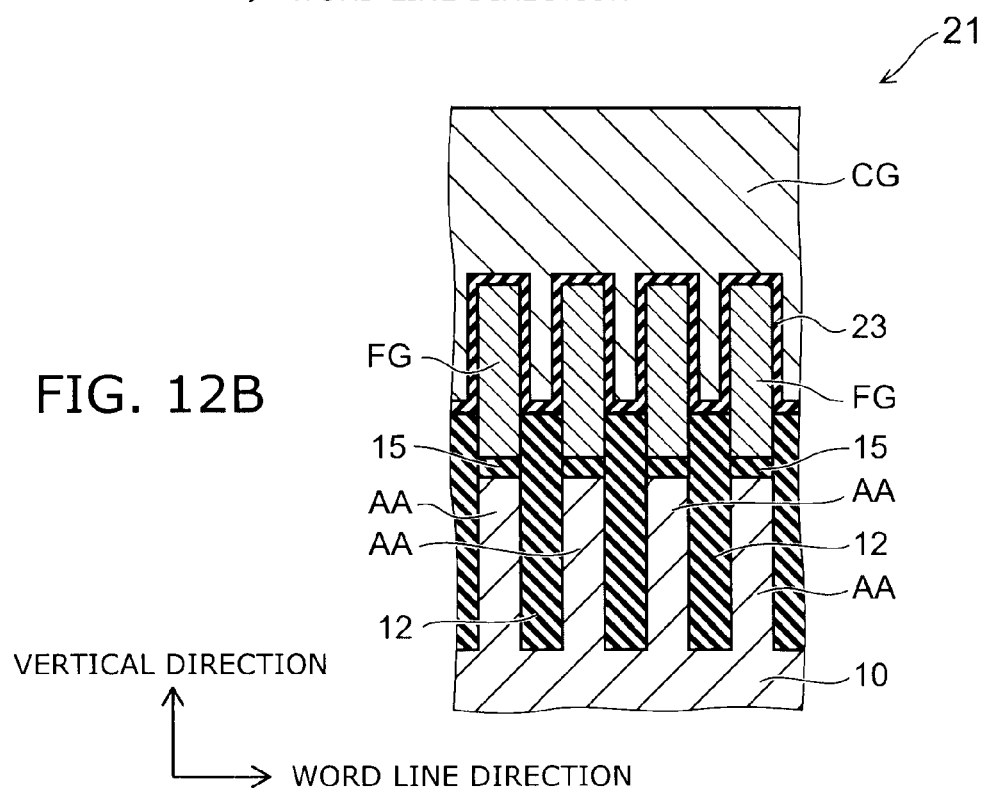

Next, as shown in FIGS. 12A and 12B, the silicon oxide film 19 is formed on the exposed surface of the silicon substrate 10 by, for example, the deposition method. Next, silicon nitride is deposited on the entire surface to form the stopper film 16, silicon oxide is deposited to form the interlayer insulating film 14, silicon nitride is deposited to form the stopper film 17, and silicon oxide is deposited to form the interlayer insulating film 18. In the cell array region Rca, the stopper film 16, the interlayer insulating film 14, the stopper film 17, and the interlayer insulating film 18 are formed so as to cover the stacked bodies 21 and 22, which are omitted in FIG. 12B.

Next, as shown in FIG. 3 and FIG. 4A, a mask (not shown) is formed on the interlayer insulating film 18. An opening for forming the contact CB is formed in the mask. The opening has a shape of, for example, a circle, ellipse, or rectangle, and it is aimed to locate the opening so that the center of the opening may be located immediately above the center line of the active area AA and both ends of the opening may protrude to immediately above the insulating block 13. Also an opening for forming a contact in the peripheral circuit region may be formed in the mask at this time.

Next, the mask is used as a mask to perform etching such as RIE. The conditions of the etching are set so as to etch silicon oxide and hardly etch silicon nitride. Thereby, a contact hole 55 is formed in the interlayer insulating film 18 by etching the interlayer insulating film 18 using the stopper film 17 as a stopper. Next, the conditions are switched to those where silicon nitride is etched, and the same mask is used to perform etching. Thereby, the stopper film 17 is etched using the interlayer insulating film 14 as a stopper, and the contact hole 55 extends downward in the stopper film 17.

Next, the conditions are switched again to those where silicon oxide is etched and silicon nitride is hardly etched, and the same mask is used to perform etching. Thereby, the interlayer insulating film 14 is etched, and the contact hole 55 extends downward in the interlayer insulating film 14. At this time, a portion of the contact hole 55 reaches the portion covering the insulating block 13 of the stopper film 16. However, since the stopper film 16 is formed of silicon nitride, the etching rate of the stopper film 16 is significantly small as compared to the etching rate of the interlayer insulating film 14. Therefore, while the interlayer insulating film 14 is etched, the stopper film 16 is hardly etched, and the contact hole 55 does not penetrate through the stopper film 16, or even if the contact hole 55 penetrates through the stopper film 16, it hardly enters the insulating block 13 and does not penetrate through the insulating block 13 because also the insulating block 13 is formed of silicon nitride. Consequently, the contact hole 55 is shaped so as to go around the insulating block 13, and reaches the potion located directly on the active area AA of the stopper film 16.

Next, etching is performed under the conditions for etching silicon nitride to cause the contact hole 55 to penetrate through the stopper film 16. Next, etching is performed under the conditions for etching silicon oxide to cause the contact hole 55 to penetrate through the silicon oxide film 19. Thereby, the contact hole 55 reaches the active area AA. At this time, it does not matter if the contact hole 55 digs down into the active area AA. Next, a conductive material such as a metal is buried in the contact hole 55. Thereby, the contact CB is formed. After that, a bit line (not shown) extending in the bit line direction is formed on the interlayer insulating film 18 to be connected to the contact CB. Thus, the semiconductor device 2 according to the embodiment is manufactured.

Next, effects of the embodiment are described.

In the embodiment, similar effects to the first embodiment described above can be obtained in the semiconductor device 2 in which the memory region and the peripheral circuit region are defined and the cell array region Rca and the bit line contact region Rbc are defined in the memory region. That is, the arrangement period of the active area AA can be shortened while ensuring a sufficient inter-AA/CB distance, and the semiconductor device 2 can be downsized.

Furthermore, in the embodiment, the height h of the upper end of the insulating block 13 from the upper surface of the active area AA is larger than half the arrangement period of the active area AA in the word line direction. Thereby, the inter-AA/CB distance is ensured more certainly.

Furthermore, in the embodiment, the width (the length in the word line direction) of the lower end of the contact CB is made thicker than the width (the length in the word line direction) of the upper end of the active area AA. Thereby, even in the case where the position of the contact CB with respect to the active area AA is out of alignment, the contact CB can be made in contact with the active area AA over the entire width thereof, and the contact resistance between the contact CB and the active area AA can be reduced to a low level. Also in this case, since the insulating block 13 is interposed between the contact CB and an adjacent active area AA, a necessary inter-AA/CB distance can be ensured to ensure a breakdown voltage.

Furthermore, according to the embodiment, the semiconductor device 2 described above can be manufactured using common semiconductor processes. Otherwise, the configuration, manufacturing method, and effects of the embodiment are similar to those of the first embodiment described above.

Next, a third embodiment is described.

Figure 13:
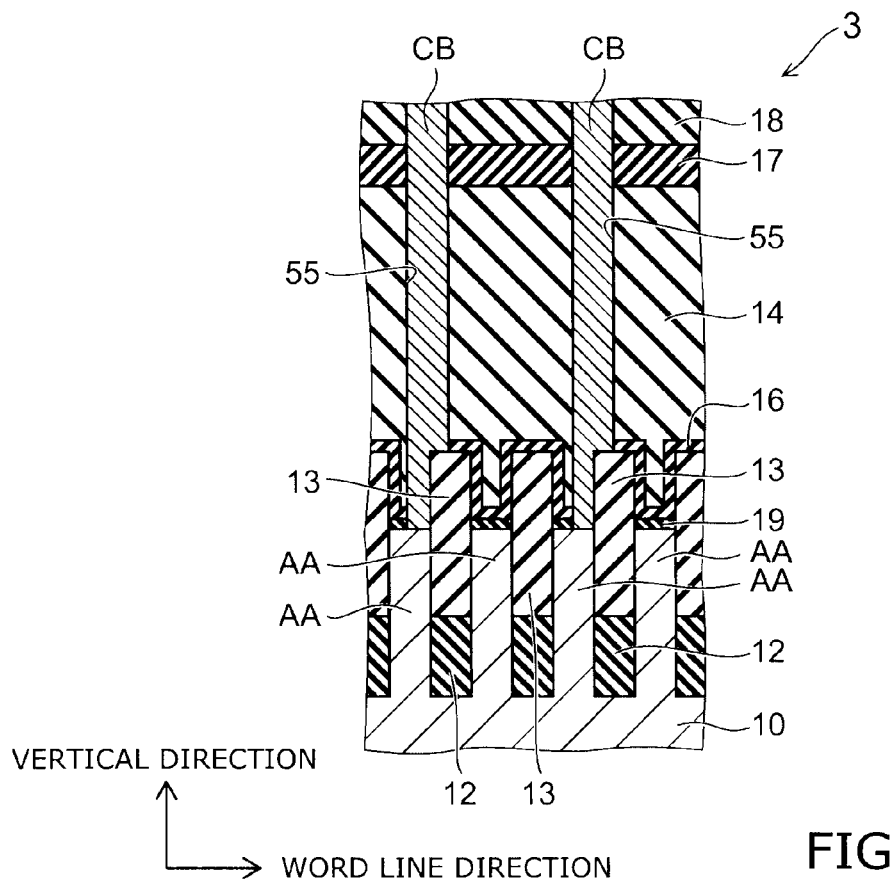
FIG. 13 is a cross-sectional view illustrating a semiconductor memory device according to the embodiment.

FIG. 13 is a cross-sectional view illustrating a semiconductor memory device according to the embodiment.

FIG. 13 shows a cross section corresponding to FIG. 4A. That is, the drawing shows a cross section perpendicular to the bit line direction in the bit line contact region Rbc.

As shown in FIG. 13, a semiconductor device 3 according to the embodiment differs from the semiconductor device 2 (see FIG. 4A) according to the second embodiment described above in that the position of the insulating block 13 is low. However, also in this case, the height of the upper end of the insulating block 13 from the upper surface of the active area AA is preferably larger than half the arrangement period of the active area AA in the word line direction. The semiconductor device 3 thus configured is manufactured by a method in which the upper surface of the STI 12 is recessed more downward in the process shown in FIGS. 6A and 6B, and also the insulating block 13 is etched partway when the stacked bodies 21 and 22 are processed in the process shown in FIGS. 11A and 11B. Otherwise, the configuration, manufacturing method, and effects of the embodiment are similar to those of the second embodiment described above.

Next, a fourth embodiment is described.

Figure 14:
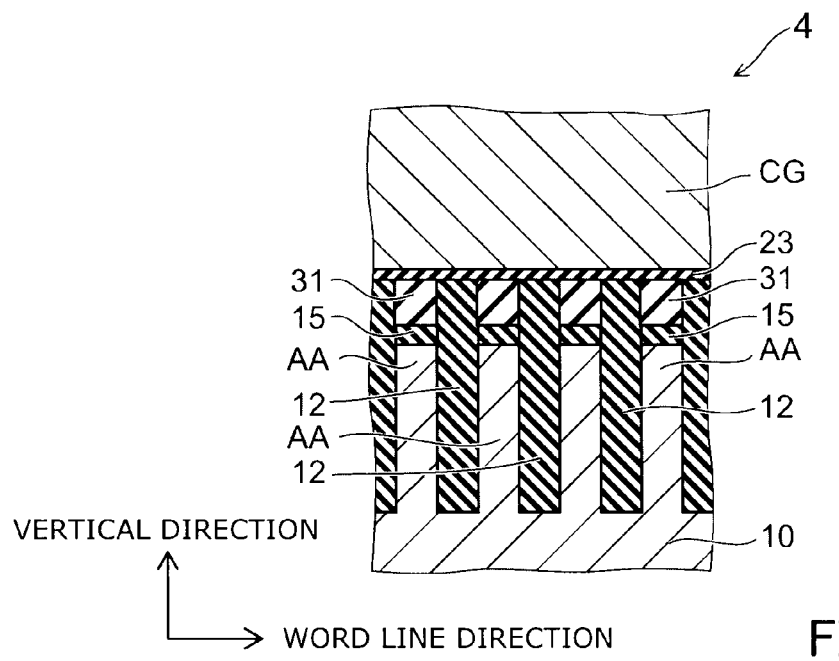
FIG. 14 is a cross-sectional view illustrating a semiconductor memory device according to the embodiment.

FIG. 14 is a cross-sectional view illustrating a semiconductor memory device according to the embodiment.

FIG. 14 shows a cross section corresponding to FIG. 4B. That is, the drawing shows a cross section perpendicular to the bit line direction in the cell array region Rca.

As shown in FIG. 14, a semiconductor device 4 according to the embodiment differs from the semiconductor device 2 (see FIG. 4B) according to the second embodiment described above in that a charge storage member 31 made of an insulating material, for example silicon nitride, is provided in place of the floating gate electrode FG (see FIG. 4B) made of a conductive material. The charge storage member 31 is a member made of an insulating material capable of storing a charge, and for example, includes a trap site for an electron. The upper surface of the charge storage member 31 is included in the same plane as the upper surface of the STI 12, and the inter-electrode insulating film 23 is flat.

According to the embodiment, a MONOS (metal-oxide-nitride-oxide-silicon) structure is obtained by means of the control gate electrode CG, the inter-electrode insulating film 23, the charge storage member 31, the tunnel film 15, and the active area AA. Otherwise, the configuration, manufacturing method, and effects of the embodiment are similar to those of the second embodiment described above.

Next, a fifth embodiment is described.

Figure 15A:
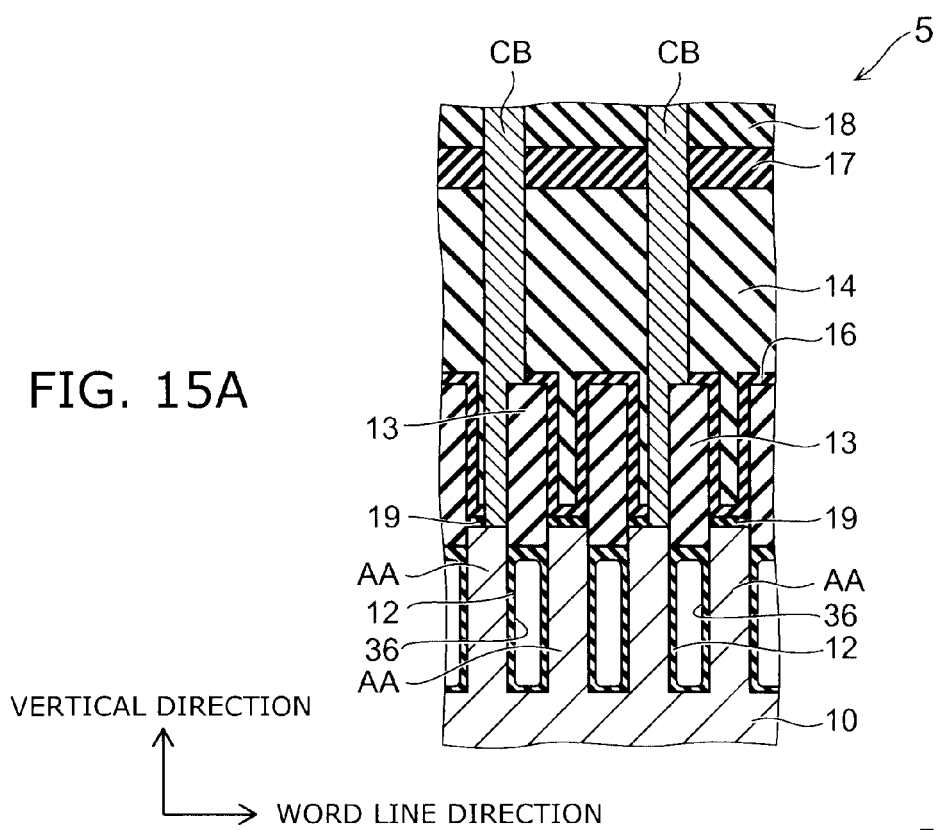
FIG. 15A shows a cross section corresponding to FIG. 4A.
Figure 15B:
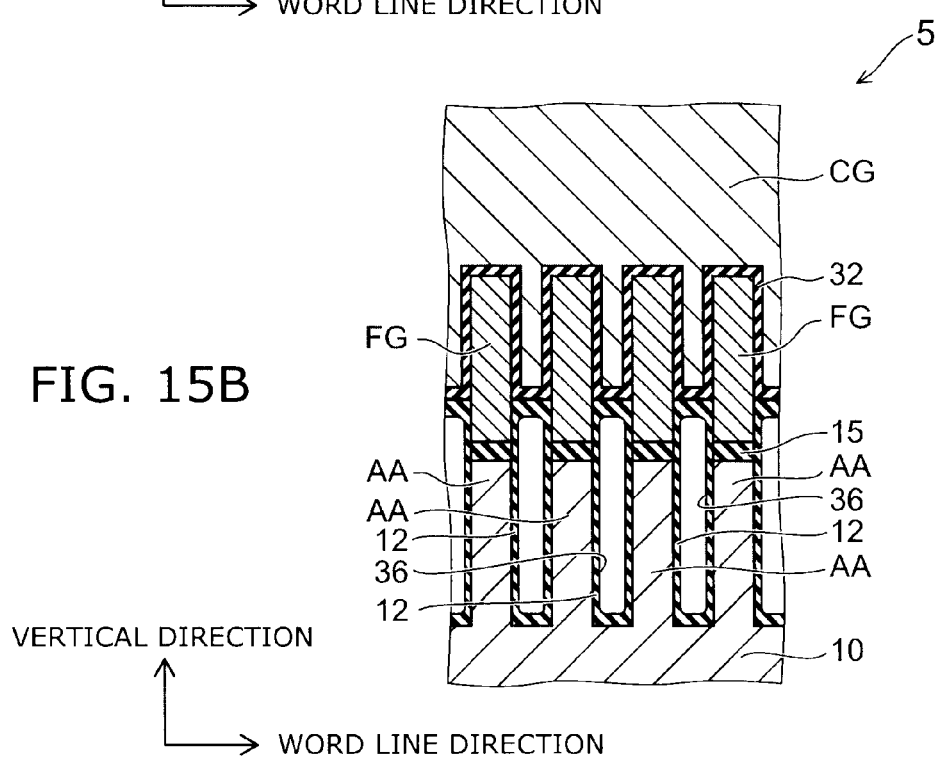
FIG. 15B shows a cross section corresponding to FIG. 4B.

FIGS. 15A and 15B are cross-sectional views illustrating a semiconductor memory device according to the embodiment.

FIG. 15A shows a cross section corresponding to FIG. 4A, and FIG. 15B shows a cross section corresponding to FIG. 4B.

As shown in FIGS. 15A and 15B, a semiconductor device 5 according to the embodiment differs from the semiconductor device 2 (see FIGS. 4A and 4B) according to the second embodiment described above in that an air gap 36 extending in the bit line direction is formed in the STI (an element isolation insulator) 12. The air gap 36 is individually formed over the plurality of cell array regions Rca, the plurality of bit line contact regions Rbc, and the plurality of source line contact regions (not shown).

In the embodiment, by forming the air gap 36 in the STI 12, the dielectric constant of the portion between active areas AA can be reduced to suppress the interference between the active areas AA. Furthermore, since the insulating block 13 is provided between the interlayer insulating film 14 and the STI 12 in the bit line contact region Rbc, the contact hole 55 is prevented from being connected to the air gap 36, and therefore the metal material forming the contact CB is prevented from entering the air gap 36. This prevents malfunctions such as one in which the metal material enters the air gap 36 via the contact hole 55 and reaches the vicinity of the floating gate electrode FG to short-circuit floating gate electrodes FG. Thus, according to the embodiment, even when the air gap 36 is formed in order to suppress the interference between active areas AA, the metal material forming the contact CB can be prevented from entering the air gap 36 because the insulating block 13 is provided. Otherwise, the configuration, manufacturing method, and effects of the embodiment are similar to those of the second embodiment described above.

In the embodiments described above, examples are descried in which the insulating block 13 is formed of silicon nitride (SiN), but the material of the insulating block 13 is not limited thereto. The material of the insulating block 13 needs only to be an insulating material capable of providing an etching selectivity with the interlayer insulating film 14; and may be also selected from, for example, carbon-doped silicon (SiC), silicon carbonitride (SiCN), silicon oxynitride (SiON), and alumina ($Al_2O_3$), as well as silicon nitride (SiN) described above. Also the material of the interlayer insulating film 14 is not limited to silicon oxide ($SiO_2$) but needs only to be an insulating material capable of providing an etching selectivity with the insulating block 13. However, when the insulating block 13 and the interlayer insulating film 14 are made of a silicon-containing material, the affinity with the silicon substrate is good and also handling in silicon processes is easy.

The embodiment described above can provide a semiconductor device that can be downsized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a semiconductor substrate, a plurality of active areas extending in one direction and protruding upward being formed at an upper surface of the semiconductor substrate;
   an element isolation insulator embedded in a lower portion of a trench between the active areas;
   an insulating block made of a first insulating material and disposed directly on the element isolation insulator, a lower portion of the insulating block being disposed in the trench, an upper portion of the insulating block protruding above an upper end of the active area;
   an interlayer insulating film made of a second insulating material different from the first insulating material and provided on an upper side of the semiconductor substrate and the insulating block; and
   a contact formed in the interlayer insulating film, a lower end of the contact being connected to an upper surface of the active area, a part of a lower surface of the contact located directly on the insulating block being positioned higher than a part of a lower surface of the contact located directly on the active area.

2. The device according to claim 1, wherein the first insulating material is silicon nitride and the second insulating material is silicon oxide.

3. The device according to claim 1, wherein the contact contacts two of the insulating blocks which are provided on both sides of the contact.

4. The device according to claim 1, wherein a height of an upper end of the insulating block from an upper surface of the active area is larger than half an arrangement period of the active area.

5. The device according to claim 1, wherein an air gap extending in the one direction is formed in the element isolation insulator.

6. The device according to claim 1, wherein the element isolation insulator is formed of the second insulating material.

7. The device according to claim 1, wherein the semiconductor substrate, the first insulating material, and the second insulating material contain silicon.

8. The device according to claim 1, further comprising:
   select gate electrodes individually provided in portions of the active area on both sides of the contact and extending in another direction intersecting with the one direction;
   a tunnel film provided on a portion of the active area located on an opposite side of the select gate electrode from the contact;
   a plurality of charge storage films provided on the tunnel film and arranged along the one direction;
   an inter-electrode insulating film provided on the charge storage films; and
   a plurality of control gate electrodes provided above the charge storage films via the inter-electrode insulating film and extending in the other direction.

9. The device according to claim 8, wherein
   the charge storage films are made of a conductive material,
   an upper surface of the charge storage films are located higher than an upper surface of the element isolation insulator, and
   the inter-electrode insulating film is bent along an upper surface and an upper portion of a side surface of the charge storage member and an upper surface of the element isolation insulator.

10. The device according to claim 8, wherein
    the charge storage films are made of an insulating material, and
    upper surfaces of the charge storage films are included in the same plane as an upper surface of the element isolation insulator.

11. A semiconductor device comprising:
    a semiconductor substrate, a plurality of active areas extending in one direction and protruding upward being formed at an upper surface of the semiconductor substrate;
    an element isolation insulator made of silicon oxide and embedded in a lower portion of a trench between the active areas;
    an insulating block made of silicon nitride and disposed directly on the element isolation insulator, a lower portion of the insulating block being disposed in the trench, an upper portion of the insulating block protruding above an upper end of the active area;
    an interlayer insulating film made of silicon oxide and provided on an upper side of the semiconductor substrate and the insulating block;
    a contact formed in the interlayer insulating film, a lower end of the contact being connected to an upper surface of the active area;
    select gate electrodes individually provided in portions of the active area on both sides of the contact and extending in another direction intersecting with the one direction;
    a tunnel film provided on a portion of the active area located on an opposite side of the select gate electrode from the contact;
    a plurality of charge storage films, provided on the tunnel film, and arranged along the one direction;
    an inter-electrode insulating film provided on the charge storage films; and
    a control gate electrode provided above the charge storage films via the inter-electrode insulating film and extending in the other direction, a part of a lower surface of the contact located directly on the insulating block being positioned higher than a part of a lower surface of the contact located directly on the active area, a height of an upper end of the insulating block from an upper surface of the active area being larger than half an arrangement period of the active area.

\* \* \* \* \*